(12) United States Patent
Jang

(10) Patent No.: US 9,148,108 B2
(45) Date of Patent: Sep. 29, 2015

(54) BAND PASS FILTER

(75) Inventor: Seung Goo Jang, Gyeonggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 357 days.

(21) Appl. No.: 13/605,069

(22) Filed: Sep. 6, 2012

(65) Prior Publication Data

US 2013/0076457 A1    Mar. 28, 2013

(30) Foreign Application Priority Data

Sep. 26, 2011    (KR) .................. 10-2011-0097062

(51) Int. Cl.
  *H03H 7/01*    (2006.01)
  *H03H 7/09*    (2006.01)
  *H03H 1/00*    (2006.01)

(52) U.S. Cl.
  CPC ........... *H03H 7/0115* (2013.01); *H03H 7/0161* (2013.01); *H03H 7/09* (2013.01); *H03H 7/1775* (2013.01); *H03H 2001/0085* (2013.01)

(58) Field of Classification Search
  CPC .............. H03H 2001/0085; H03H 7/0115; H03H 7/0161; H03H 7/09
  USPC .................................................. 333/175, 185
  See application file for complete search history.

(56) References Cited

U.S. PATENT DOCUMENTS

| | | | |
|---|---|---|---|
| 7,418,251 B2 * | 8/2008 | Liu | 455/333 |
| 2008/0223603 A1 | 9/2008 | Kim et al. | |
| 2009/0278627 A1 * | 11/2009 | Umemoto et al. | 333/185 |

FOREIGN PATENT DOCUMENTS

| | | |
|---|---|---|
| KR | 10-2005-0082225 | 8/2005 |
| KR | 10-2006-0016058 | 2/2006 |
| KR | 10-0849791 | 7/2008 |
| KR | 10-2009-0094980 | 9/2009 |
| KR | 10-2011-0006353 | 1/2011 |

* cited by examiner

*Primary Examiner* — Benny Lee
*Assistant Examiner* — Rakesh Patel
(74) *Attorney, Agent, or Firm* — NSIP Law

(57) ABSTRACT

Provided is a band pass filter constituted by a printed circuit board (PCB) and a multi-layer ceramic chip (MLCC) to be mounted in a circuit, without additional parts such as a low temperature co-fired ceramic (LTCC) based filter, and so on, and it is an object to produce a band pass filter constituted by an inductor formed of a PCB pattern and a capacitor formed of an MLCC to implement a high performance and compact band pass filter. The band pass filter includes an inductor pattern part formed of a plurality of PCB patterns and having inductance; an MLCC part constituted by a plurality of MLCCs mounted in a lower end side of the inductor pattern part and having a capacitance; and a port part formed of a plurality of PCB patterns and connected to the PCB patterns extending from the inductor pattern part.

24 Claims, 7 Drawing Sheets

100

200

300

400

600

BAND PASS FILTER

CROSS-REFERENCE TO RELATED APPLICATIONS

This application claims the benefit of Korean Patent Application No. 10-2011-0097062 filed with the Korea Intellectual Property Office on Sep. 26, 2011, the disclosure of which is incorporated herein by reference.

BACKGROUND OF THE INVENTION

1. Field of the Invention

The present invention relates to a band pass filter, and more particularly, to a band pass filter constituted by a printed circuit board (PCB) and a multi-layer ceramic chip (MLCC) to be mounted in a circuit, without additional parts such as a low temperature co-fired ceramic (LTCC) based filter, and so on.

2. Description of the Related Art

In general, filters may be classified into an LTCC based filter, a PCB or MLCC filter, or a filter in which an inductor and a capacitor are coupled to each other.

The LTCC filter, which is a filter implemented using a multi-layer ceramic substrate, has a large tolerance to decrease productivity. In addition, the LTCC filter is formed of a fragile material to decrease reliability and increase production cost, and its design is very difficult and its pass band is fixed.

The PCB filter, which is a filter implemented by only a PCB pattern, generally has a large size varied according to a frequency, and a pass band according to design thereof is fixed.

Specific design of the filter in which the inductor and the capacitor are coupled to each other is difficult due to limitation in device value, and performance of the filter may be decreased due to a low Q value of the inductor.

SUMMARY OF THE INVENTION

The present invention has been invented in order to overcome the above-described problems and it is, therefore, an object of the present invention to provide a band pass filter constituted by an inductor formed of a PCB pattern and a capacitor formed of an MLCC to implement a high performance and compact band pass filter with a relatively low cost, and produce the band pass filter having high productivity and reliability.

In accordance with one aspect of the present invention to achieve the object, there is provided a band pass filter including: an inductor pattern part formed of a plurality of PCB patterns and having inductance; a multi-layer ceramic chip (MLCC) part constituted by a plurality of MLCCs mounted in a lower end side of the inductor pattern part and having a capacitance; and a port part formed of a plurality of PCB patterns and connected to the PCB patterns extending from the inductor pattern part.

The inductor pattern part may include an L1 inductor pattern; and an L2 inductor pattern horizontally symmetrically and parallelly disposed with respect to the L1 inductor pattern and having the same pattern length and pattern width as the L1 inductor pattern.

The MLCC may include a first MLCC mounted in a lower end side of the L1 inductor pattern; a second MLCC mounted in a lower end side of the L2 inductor pattern and horizontally symmetrically disposed with respect to the first MLCC; and a third MLCC.

The band pass filter may further include a first connecting pattern, which is a PCB pattern, configured to connect the first MLCC and the third MLCC; and a second connecting pattern, which is a PCB pattern, connected to connect the second MLCC and the third MLCC and horizontally symmetrical to the first connecting pattern, wherein the port part may include a first port, which is a PCB pattern, formed on the first connecting pattern; and a second port, which is a PCB pattern, formed on the second connecting pattern.

The band pass filter may further include a lower pattern formed at an opposite side of the inductor pattern part; a dielectric substance formed between the inductor pattern part and the lower pattern; and via holes formed between the lower pattern and the L1 inductor pattern and between the lower pattern and the L2 inductor pattern.

The lower pattern may be a ground.

The L1 inductor pattern, the L2 inductor pattern, the first connecting pattern, the second connecting pattern, the first port, the second port, the lower pattern, and the via holes may be formed of a metal material.

The L1 inductor pattern and the L2 inductor pattern may have different lengths and widths.

The band pass filter in accordance with another exemplary embodiment of the present invention may further include a first connecting pattern, which is a PCB pattern, configured to connect the first MLCC and the third MLCC; and a second connecting pattern, which is a PCB pattern, configured to connect the second MLCC and the third MLCC, wherein the port part may include a first port, which is a PCB pattern, formed on the first connecting pattern in a leftward direction; and a second port, which is a PCB pattern, formed on the first connecting pattern in a rightward direction.

The band pass filter may further include a lower pattern formed at an opposite side of the inductor pattern part; a dielectric substance formed between the inductor pattern part and the lower pattern; and via holes formed between the lower pattern and the L1 inductor pattern and between the lower pattern and the L2 inductor pattern.

The lower pattern may be a ground.

The L1 inductor pattern, the L2 inductor pattern, the first connecting pattern, the second connecting pattern, the first port, the second port, the lower pattern, and the via holes may be formed of a metal material.

The L1 inductor pattern and the L2 inductor pattern may have different lengths and widths.

The band pass filter in accordance with another exemplary embodiment of the present invention may further include a first connecting pattern, which is a PCB pattern, configured to connect the first MLCC and the third MLCC; and a second connecting pattern, which is a PCB pattern, configured to connect the second MLCC and the third MLCC and horizontally symmetrical to the first connecting pattern, wherein the port part may include a first port, which is a PCB pattern, formed on the first connecting pattern; and a second part, which is a PCB pattern, formed on the second connecting pattern.

The band pass filter may further include a lower pattern formed on an opposite side of the inductor pattern part; a dielectric substance formed between the inductor pattern part and the lower pattern; and via holes formed between the lower pattern and the L1 inductor pattern and between the lower pattern and the L2 inductor pattern.

The lower pattern may be a ground.

The L1 inductor pattern, the L2 inductor pattern, the first connecting pattern, the second connecting pattern, the first port, the second port, the lower pattern, and the via holes may be formed of a metal material.

The L1 inductor pattern and the L2 inductor pattern may have different lengths and widths.

The band pass filter in accordance with another exemplary embodiment of the present invention may further include a first ground pattern, which is a PCB pattern, connected to an upper end of the L1 inductor pattern and an upper end of the L2 inductor pattern; and a second ground pattern, which is a PCB pattern, connected to a lower end of the first MLCC and a lower end of the second MLCC.

The band pass filter may further include a lower pattern formed at an opposite side of the inductor pattern part; and a dielectric substance formed between the inductor pattern part and the lower pattern.

The L1 inductor pattern, the L2 inductor pattern, the first connecting pattern, the second connecting pattern, the first port, the second port, the lower pattern, and the via holes may be formed of a metal material.

The L1 inductor pattern and the L2 inductor pattern may have different lengths and widths.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Specific embodiments of the present invention will be described in detail with reference to the accompanying drawings. The following embodiments are provided as examples to fully convey the spirit of the invention to those skilled in the art.

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

This invention may be embodied in different forms and should not be construed as limited to the embodiments set forth herein. Rather, these embodiments are provided so that this disclosure will be thorough and complete, and will fully convey the scope of the invention to those skilled in the art.

Hereinafter, the present invention will be described in detail with reference to the accompanying drawings.

Figure 1:
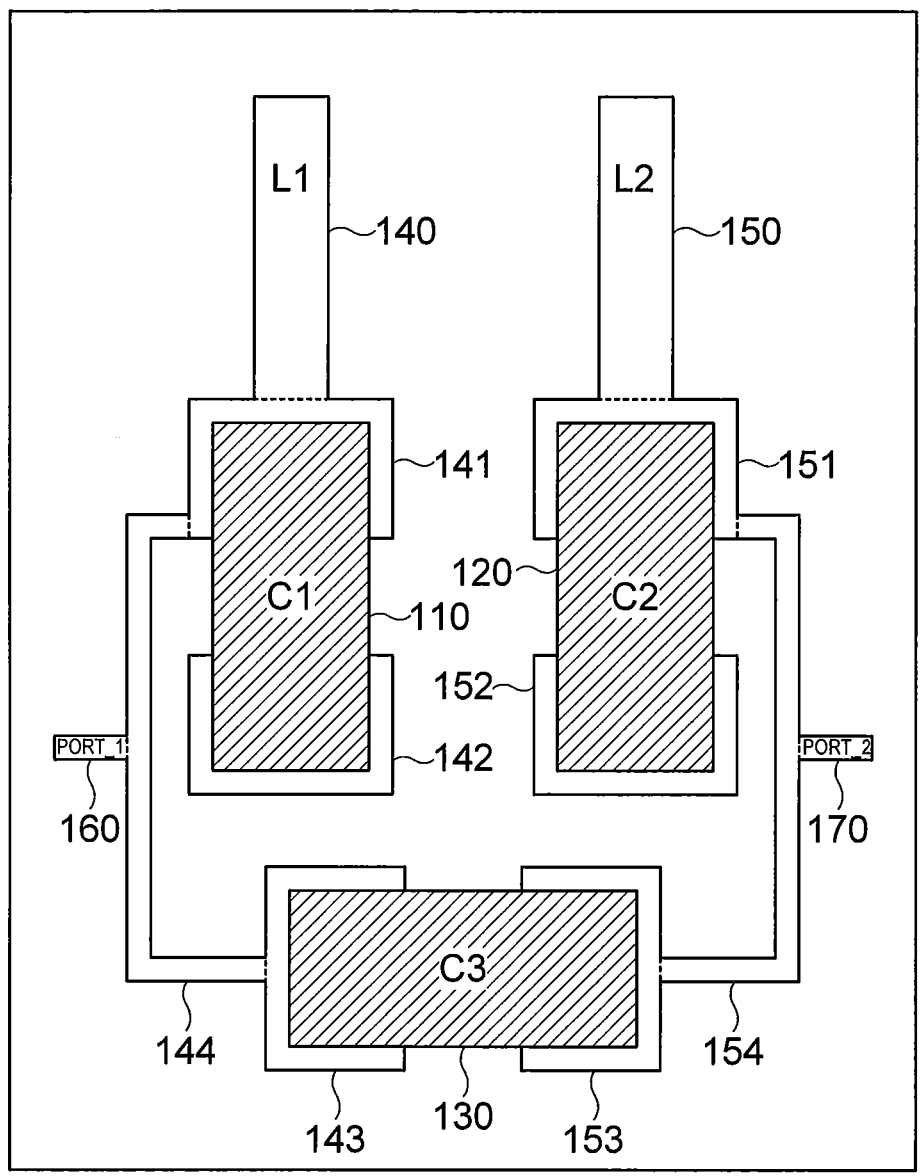
FIG. 1 is a plan view of a band pass filter in accordance with an exemplary embodiment of the present invention.
Figure 2:
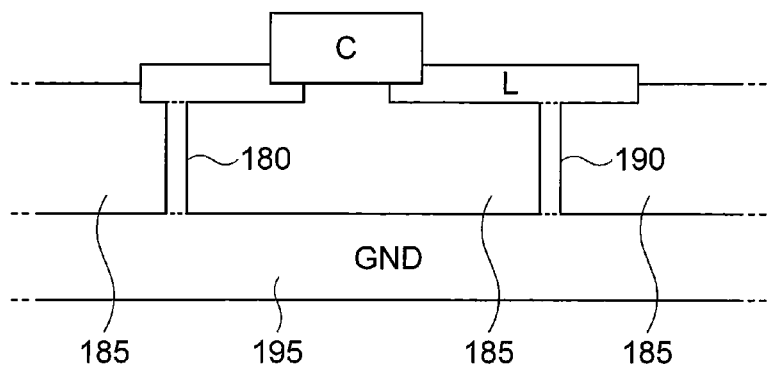
FIG. 2 is a cross-sectional view of the band pass filter in accordance with an exemplary embodiment of the present invention.

FIG. 1 is a plan view of a band pass filter in accordance with an exemplary embodiment of the present invention, and FIG. 2 is a cross-sectional view of the band pass filter in accordance with an exemplary embodiment of the present invention.

The band pass filter in accordance with an exemplary embodiment of the present invention may include an inductor pattern part formed of a plurality of PCB pattern and having an inductance; an MLCC part formed of a plurality of MLCC mounted in a lower end side of the inductor pattern part and having a capacitance; and a port part formed of a plurality of PCB pattern and connected to the PCB patterns extending from the inductor pattern part.

Referring to FIG. 1, the inductor pattern part may include an L1 inductor pattern 140, and an L2 inductor pattern 150 horizontally symmetrically and parallelly disposed with respect to the L1 inductor 140 and having the same pattern length and pattern width as the L1 inductor pattern 140.

The lengths and widths of the L1 inductor pattern 140 and the L2 inductor pattern 150 can determine a value of a resonance frequency. The lengths of the L1 inductor pattern 140 and the L2 inductor pattern 150 may be in reverse proportion to the resonance frequency. However, the widths of the L1 inductor pattern 140 and the L2 inductor pattern 150 may be in proportion to the resonance frequency. Accordingly, as the lengths and widths of the L1 inductor pattern 140 and the L2 inductor pattern 150 are adjusted, a magnitude of the capacitance of the MLCC part can be complemented.

In addition, disposition of the L1 inductor pattern 140 and the L2 inductor pattern 150 facing each other may generate a mutual inductance.

Meanwhile, the lengths and widths of the L1 inductor pattern 140 and the L2 inductor pattern 150 may be different from each other.

The MLCC part may include a first MLCC 110 mounted in a lower end side of the L1 inductor pattern 140; a second MLCC 120 mounted in a lower end side of the L2 inductor pattern 150 and horizontally symmetrically and parallelly disposed with respect to the first MLCC 110; and a third MLCC 130.

The capacitances of the first MLCC 110 and the second MLCC 120 can determine a value of the resonance frequency. The capacitances of the first MLCC 110 and the second MLCC 120 may be in reverser proportion to the value of the resonance frequency. Disposition of the L1 inductor pattern 140 and the L2 inductor pattern 150 facing each other may form a mutual inductance, form a first resonance frequency f1 formed by the L1 inductor pattern 140 and the first MLCC 110, and form a second resonance frequency f2 formed by the L2 inductor pattern 150 and the second MLCC 120. Accordingly, a pass band of the band pass filter may be formed by the first resonance frequency and the second resonance frequency.

Meanwhile, the capacitance of the third MLCC 130 may be in reverse proportion to a magnitude of insertion loss and attenuation. The insertion loss may be a loss level of the signal passing through the band pass filter, and the attenuation magnitude may be an attenuation level of the signal stopped by the band pass filter. In addition, the L1 inductor pattern 140 and the L2 inductor pattern 150 may be coupled to each other to adjust a distance therebetween to compensate a magnitude of the capacitance of the third MLCC 130.

In this case, the MLCC part may further include a first connecting pattern 144, which is a PCB pattern, connecting the first MLCC 110 and the third MLCC 130; and a second connecting pattern 154, which is a PCB pattern, connecting the second MLCC 120 and the third MLCC 130 and horizontally symmetrically formed with respect to the first connecting pattern 144. The port part may include a first port 160, which is a PCB pattern, formed on the first connecting pattern 144; and a second port 170, which is a PCB pattern, formed on the second connecting pattern 154.

Meanwhile, the inductor pattern part may further include a first C1 pattern 141, which is a PCB pattern, connected to a lower end side of the L1 inductor pattern 140 and formed at an upper end side of the first MLCC 110; a second C1 pattern 142, which is a PCB pattern, formed at a lower end side of the first MLCC 110 and vertically symmetrical to the first C1 pattern 141; a first C2 pattern 151, which is a PCB pattern, connected to a lower end side of the L2 inductor pattern 150, formed at an upper end side of the second MLCC 120, and horizontally symmetrical to the first C1 pattern 141; a second C2 pattern 152, which is a PCB pattern, formed at a lower end side of the second MLCC 120 and vertically symmetrical to the first C1 pattern 151; a first C3 pattern 143, which is a PCB pattern, formed at a left side of the third MLCC 130; and a second C3 pattern 153, which is a PCB pattern, formed at a right side of the third MLCC 130 and horizontally symmetrical to the first C3 pattern 143.

In addition, the first C1 pattern 141 and the second C1 pattern 142, the first C2 pattern 151 and the second C2 pattern 152, and the first C3 pattern 143 and the second C3 pattern 153 may be electrically connected to each other.

Referring to FIG. 2, the band pass filter may further include a lower pattern 195 formed at an opposite side of the inductor pattern part; a dielectric substance 185 formed between the inductor pattern part and the lower pattern 195; and via holes 180 and 190 between the lower pattern 195 and the L1 inductor pattern 140, and between the lower pattern 195 and the L2 inductor pattern 150.

In this case, the lower pattern 195 may be a ground. The L1 inductor pattern part 140, the L2 inductor pattern 150, the first connecting pattern 144, the second connecting pattern 154, the first port 160, the second port 170, the lower pattern 195, and the via holes 180 and 190 may be formed of a metal material. In particular, the metal material may be copper.

Figure 3:
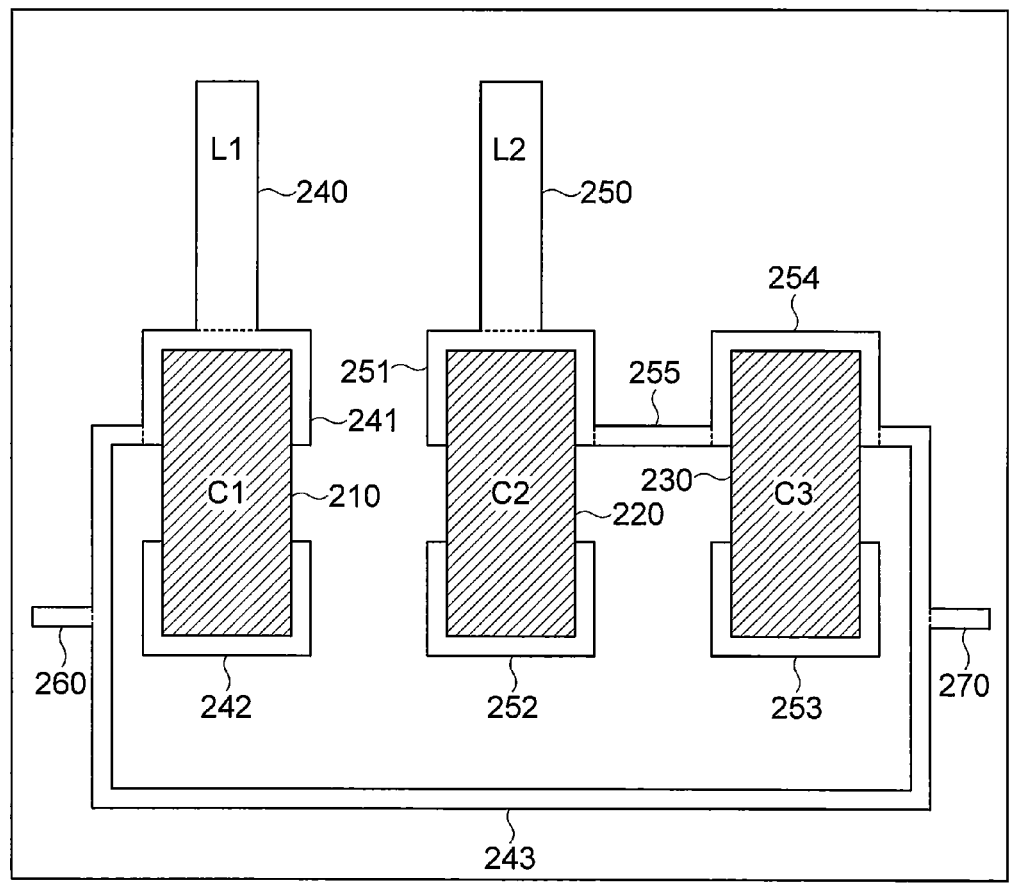
FIGS. 3 to 6 are plan views of a band pass filter in accordance with another exemplary embodiment of the present invention.
Figure 4:
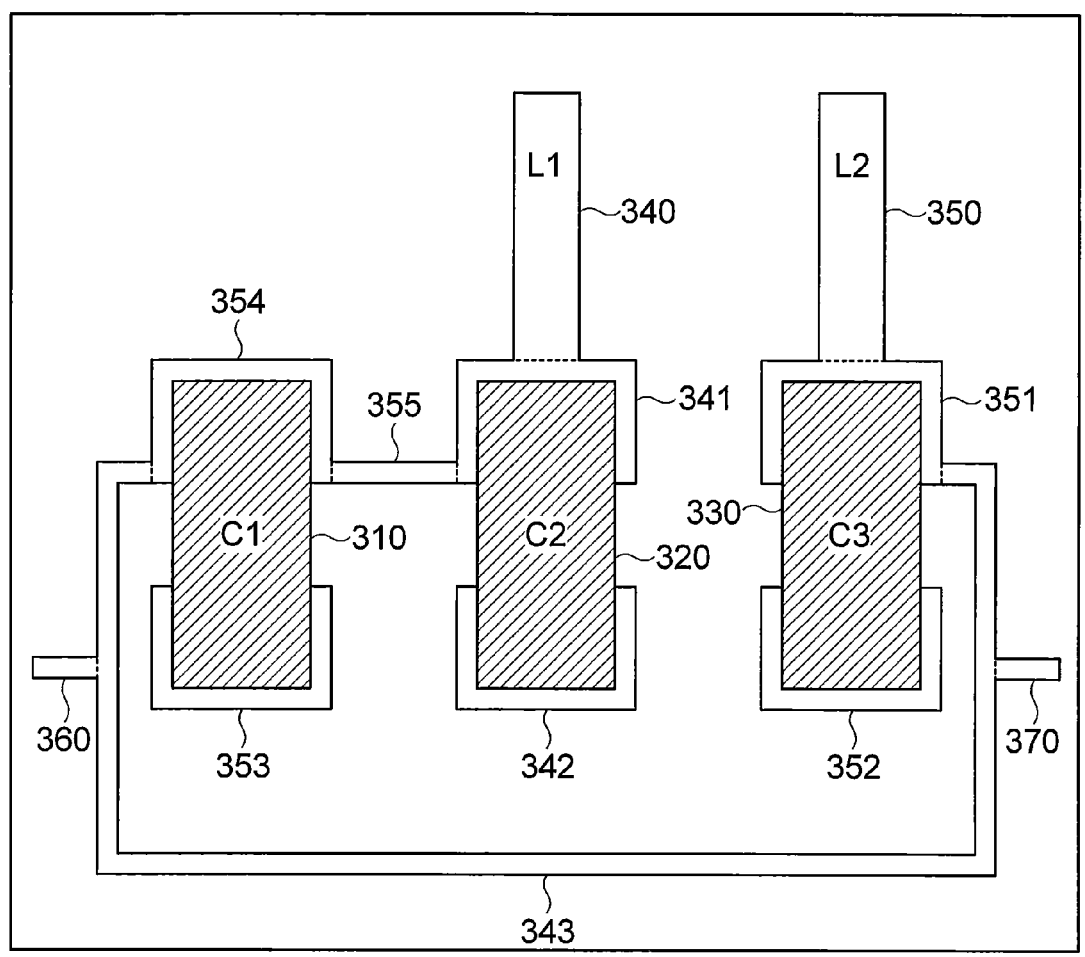

FIGS. 3 and 4 are plan views of the band pass filter in accordance with another exemplary embodiment of the present invention.

Referring to FIG. 3, the band pass filter 200 in accordance with another exemplary embodiment of the present invention may further include a first connecting pattern 243, which is a PCB pattern, configured to connect the first MLCC 210 and the third MLCC 230; and a second connecting pattern 255, which is a PCB pattern, configured to connect the second MLCC 220 and the third MLCC 230, and the port part may include a first port 260, which is a PCB pattern, formed on the first connecting pattern 243 in a leftward direction; and a second port 270, which is a PCB pattern, formed on the first connecting pattern 243 in a rightward direction. Referring to FIG. 4, the band pass filter 300 in accordance with another exemplary embodiment of the present invention may further include a first connecting pattern 343, which is a PCB pattern, configured to connect the first MLCC 310 and the third MLCC 330; and a second connecting pattern 355, which is a PCB pattern, configured to connect the first MLCC 310 and the second MLCC 320, and the port part may include a first port 360, which is a PCB pattern, formed on the first connecting pattern 343 in a leftward direction; and a second port 370, which is a PCB pattern, formed on the first connecting pattern 343 in a rightward direction.

Meanwhile, the L1 inductor patterns 240 and 340 and the L2 inductor patterns 250 and 350 may have different lengths and widths.

The band pass filter may further include a lower pattern formed at an opposite side of the inductor pattern part; a dielectric substance formed between the inductor pattern part and the lower pattern; and via holes between the lower pattern and the L1 inductor pattern, and between the lower pattern and the L2 inductor pattern. In this case, the lower pattern may be a ground. Meanwhile, the L1 inductor pattern part, the L2 inductor pattern part, the first connecting pattern, the second connecting pattern, the first port, the second port, the lower pattern, and the via holes may be formed of a metal material.

Figure 5:
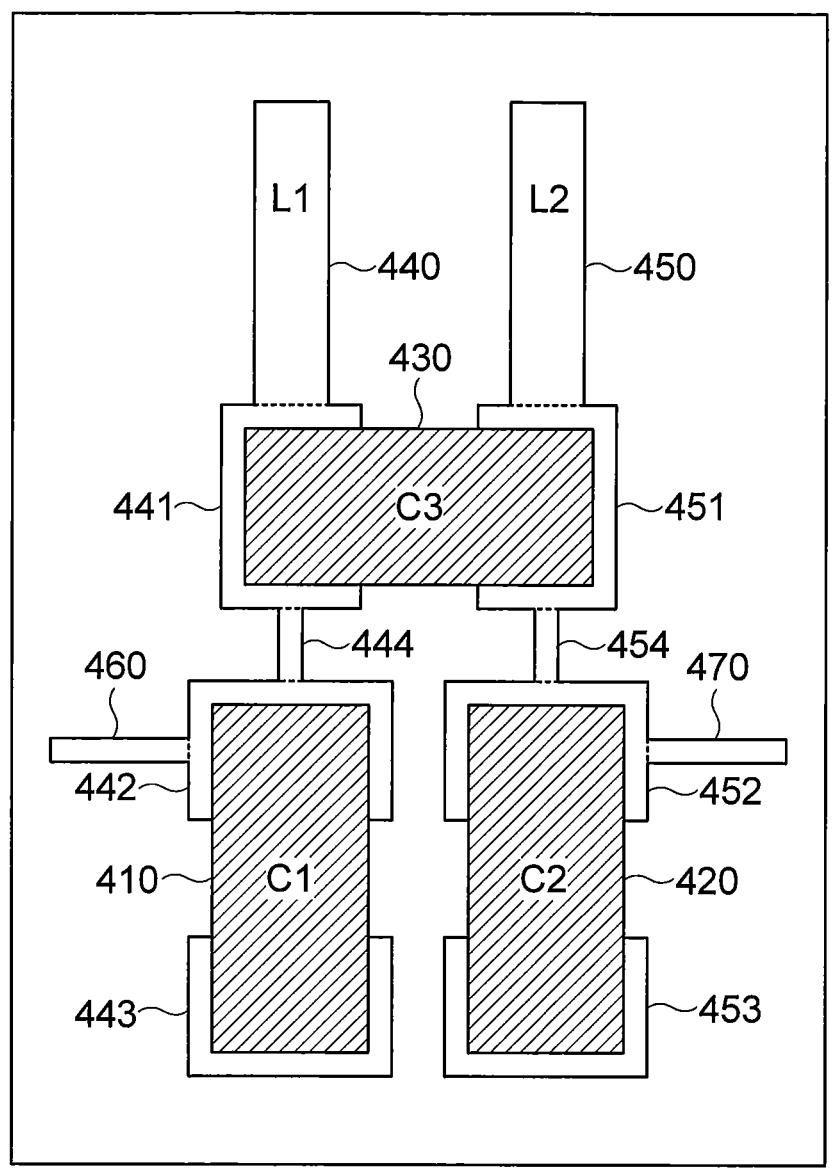
Figure 6:
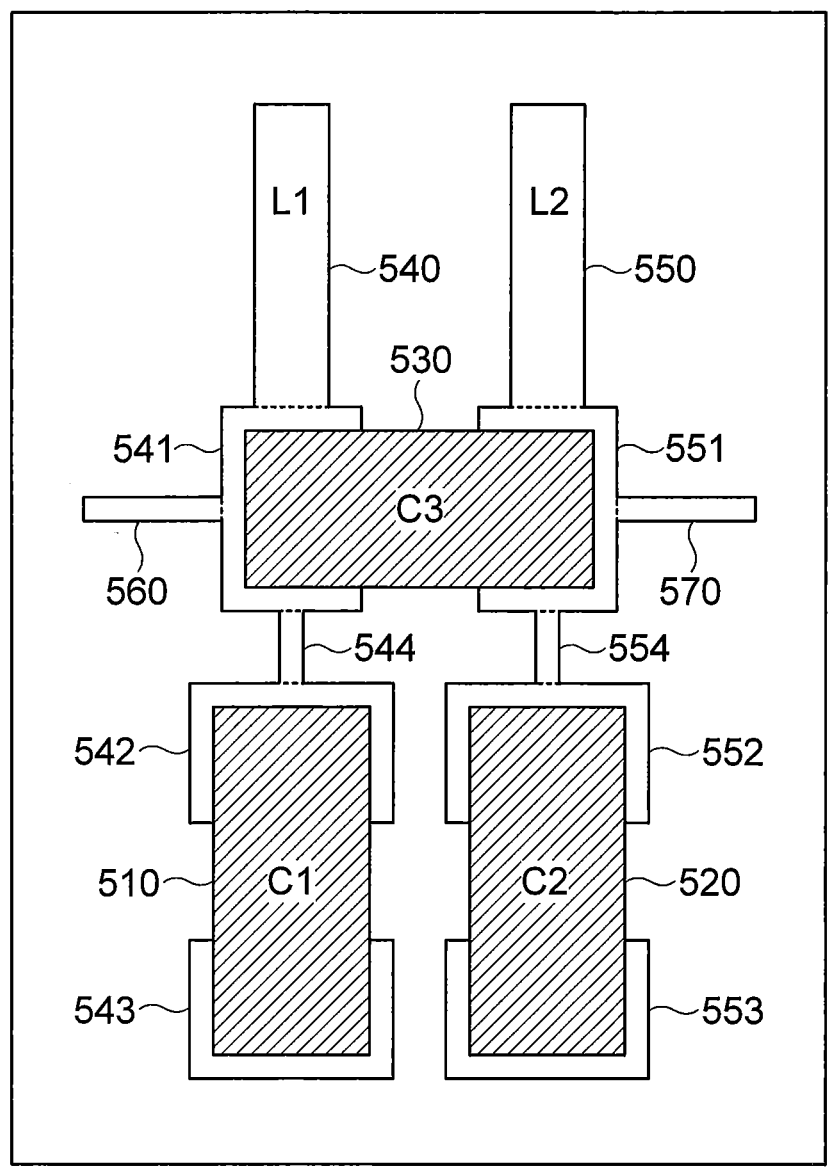

FIGS. 5 and 6 are plan views of the band pass filter in accordance with still another exemplary embodiment of the present invention.

Referring to FIG. 5, the MLCC part may include a third MLCC 430 having a left portion mounted in a lower end side of the L1 inductor pattern 440 and a right portion mounted in a lower end side of the L2 inductor pattern 450; a first MLCC 410 connected to the left lower end of the third MLCC 430; and a second MLCC 420 connected to a right lower end of the third MLCC 430.

Meanwhile, the L1 inductor pattern 440 and the L2 inductor pattern 450 may have different lengths and widths.

The band pass filter may further include a first connecting pattern 444, which is a PCB pattern, configured to connect the first MLCC 410 and the third MLCC 430; and a second connecting pattern 454, which is a PCB pattern, configured to connect the second MLCC 420 and the third MLCC 430 and horizontally symmetrical to the first connecting pattern 444, and the port part may include a first port 460, which is a PCB pattern, formed on the first connecting pattern 444; and a second port 470, which is a PCB pattern, formed on the second connecting pattern 454.

In addition, referring to FIG. 6, in the band pass filter 500 in accordance with an exemplary embodiment of the present invention, the inductor pattern may further include a first C1 pattern 542, which is a PCB pattern, connected to a lower end side of the L1 inductor pattern 540 and formed on an upper end side of the first MLCC 510; a second C1 pattern 543, which is a PCB pattern, formed at a lower end side of the first MLCC 510 and vertically symmetrical to the first C1 pattern 542; a first C2 pattern 552, which is a PCB pattern, connected to a lower end side of the L2 inductor pattern 550, formed at an upper end side of the second MLCC 520, and horizontally symmetrical to the first C1 pattern 542; a second C2 pattern 553, which is a PCB pattern, formed at a lower end side of the second MLCC 520 and vertically symmetrical to the first C2 pattern 552; a first C3 pattern 541, which is a PCB pattern, formed at a left side of the third MLCC 530; and a second C3 pattern 551, which is a PCB pattern, formed at a right side of the third MLCC 530 and horizontally symmetrical to the first C3 pattern 541. In this case, the port part may include a first port 560 connected to a left portion of the first C3 pattern 541; and a second port 570 connected to a right portion of the second C3 pattern 551.

Meanwhile, the first C1 pattern 542 and the second C1 pattern 543, the first C2 pattern 552 and the second C2 pattern 553, and the first C3 pattern 541 and the second C3 pattern 551 may be electrically connected to each other.

The band pass filter may further include a lower pattern formed at an opposite side of the inductor pattern part; a dielectric substance formed between the inductor pattern part and the lower pattern; and via holes between the lower pattern and the L1 inductor pattern, and between the lower pattern and the L2 inductor pattern. In this case, the lower pattern may be a ground.

The L1 inductor pattern part, the L2 inductor pattern part, the first connecting pattern, the second connecting pattern, the first port, the second port, the lower pattern, and the via holes may be formed of a metal material.

Figure 7:
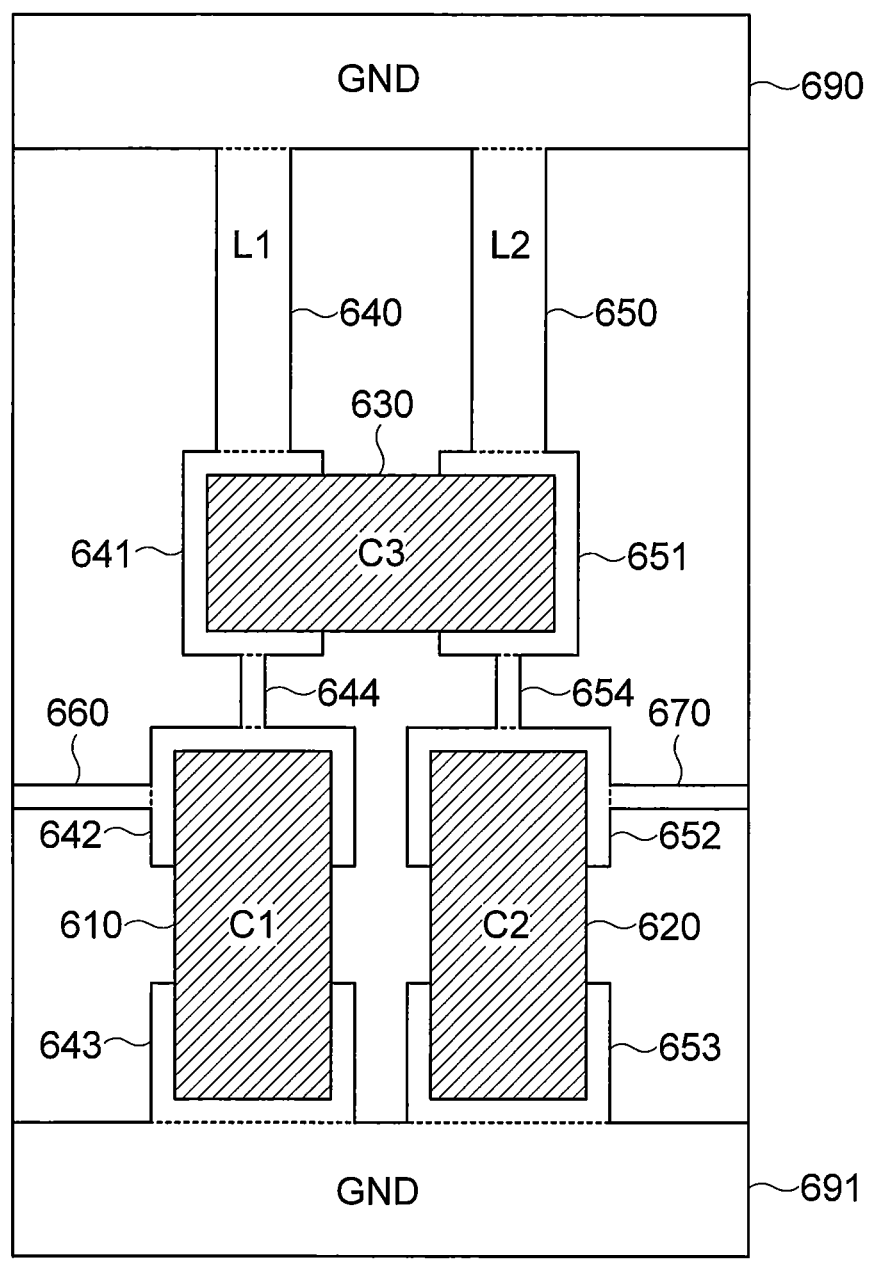
FIG. 7 is a plan view of a band pass filter in accordance with still another exemplary embodiment of the present invention.
Figure 8:
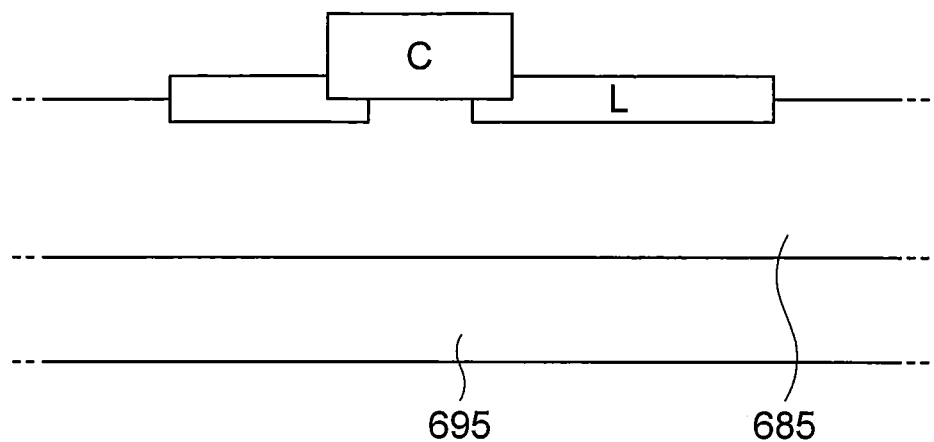
FIG. 8 is a cross-sectional view of the band pass filter in accordance with still another exemplary embodiment of the present invention.

FIG. 7 is a plan view of a band pass filter in accordance with still another exemplary embodiment of the present invention, and FIG. 8 is a cross-sectional view of the band pass filter of the embodiment.

Referring to FIG. 7, the band pass filter may further include a first ground pattern 690, which is a PCB pattern, connected to an upper end of the L1 inductor pattern 640 and an upper end of the L2 inductor pattern 650; and a second ground pattern 691, which is a PCB pattern, connected to a lower end of the first MLCC 610 and a lower end of the second MLCC 620. In this case, the first ground pattern 690 and the second ground pattern 691 may be a ground of the band pass filter 600, and may be a PCB pattern. In addition, referring to FIG. 8, the band pass filter may further include a lower pattern 695 formed at an opposite side of the inductor pattern part; and a dielectric substance 685 formed between the inductor pattern part and the lower pattern 695. The via holes may not be formed due to the first ground pattern 690 and the second ground pattern 691, and the lower pattern 695 may be a ground.

In this case, the L1 inductor pattern part 640, the L2 inductor pattern part 650, the first connecting pattern 644, the second connecting pattern 654, the first port 660, the second port 670, and the lower pattern 695 may be formed of a metal material. Meanwhile, the L1 inductor pattern 640 and the L2 inductor pattern 650 may have different lengths and widths.

Figure 9:
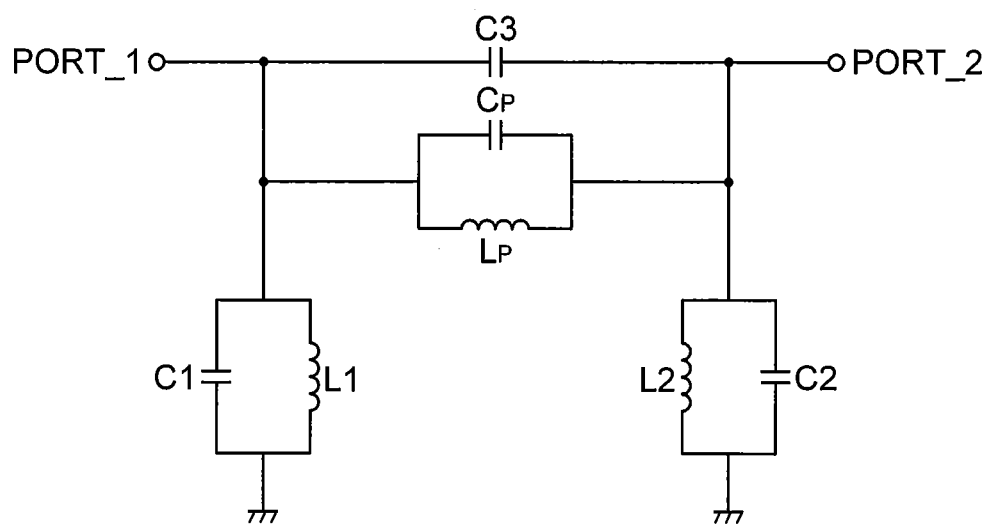
FIG. 9 is an equivalent circuit diagram of the band pass filter of the present invention.

FIG. 9 is an equivalent circuit diagram of the band pass filter of the present invention.

Referring to FIG. 9, a parallel structure of C1 and L2 may be formed by structures of the L1 inductor pattern and the first MLCC, a parallel structure of C2 and L2 may be formed by the structures of the L2 inductor pattern and the second MLCC, and C3 may be formed by the third MLCC. Meanwhile, a parallel structure of $C_p$ and $L_p$ may be formed by a structure of the L1 and L2 facing each other.

As can be seen from the foregoing, since the band pass filter can be designed with a PCB constituting a system or a module, there is no need to add a separate filter. In addition, since the filter is designed using the MLCC and the PCB, the filter can be implemented with a low cost in comparison with the filter using the LTCC.

Further, since the filter of the present invention can be implemented with the PCB pattern having a higher quality factor (Q-factor) than that of the conventional inductor and implemented with the MLCC having a lower dielectric loss than that of the LTCC, performance of the filter is increased in comparison with the conventional art.

Furthermore, the structure determining a pass band according to the present invention can be implemented with a small size in comparison with the filter implemented by only the PCB pattern.

In addition, since the pass band can be determined by varying only a capacitance value of the MLCC while maintaining a size of the filter, a degree of freedom in design is high and design of the filter with respect to the pass band can be easily performed.

Further, the filter in accordance with the present invention is inexpensive than that of the filter using the LTCC and has a small tolerance, increasing productivity and reliability.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A band pass filter comprising:
  a circuit board;
  an inductor pattern part formed of a plurality of printed circuit board (PCB) patterns comprising a first inductor pattern adjacent to a second inductor pattern, and the first inductor pattern and the second inductor pattern are located on a same plane of the circuit board and having a mutual inductance between the first inductor pattern and the second inductor pattern;
  a multi-layer ceramic chip (MLCC) part comprising a first MLCC mounted in a lower end side of the first inductor pattern and having a first capacitance and a second MLCC mounted in a lower end side of the second inductor pattern and having a second capacitance; and
  a port part formed of an another plurality of PCB patterns and connected to the inductor pattern part,
  the first inductor pattern and the second inductor pattern being adjacent to each other and having effects of another capacitance, the mutual inductance and the another capacitance being connected in parallel to each other to create an effect of a separate filter that is connected between the first inductor pattern and the second inductor pattern.

2. The band pass filter according to claim 1, wherein the second inductor pattern has a same pattern length and pattern width as the first inductor pattern.

3. The band pass filter according to claim 2, wherein the MLCC part further comprises: the second MLCC being horizontally symmetrically disposed with respect to the first MLCC; and
  a third MLCC.

4. The band pass filter according to claim 3, further comprising:
  a first connecting pattern, which is a PCB pattern, configured to connect the first MLCC and the third MLCC; and
  a second connecting pattern, which is a PCB pattern, configured to connect the second MLCC and the third MLCC,
  wherein the port part comprises:
  a first port, which is a PCB pattern, formed on the first connecting pattern; and
  a second port, which is a PCB pattern, formed on the second connecting pattern.

5. The band pass filter according to claim 3, further comprising:
  a first connecting pattern, which is a PCB pattern, configured to connect the first MLCC and the third MLCC; and
  a second connecting pattern, which is a PCB pattern, configured to connect the second MLCC and the third MLCC,
  wherein the port part comprises:
  a first port, which is a PCB pattern, formed on the first connecting pattern in a leftward direction; and
  a second port, which is a PCB pattern, formed on the second connecting pattern in a rightward direction.

6. The band pass filter according to claim 1, wherein the first inductor pattern, the second inductor pattern, the first MLCC, and the second MLCC are included on the circuit board.

7. The band pass filter according to claim 1, wherein the first inductor pattern and the second inductor pattern have different lengths and widths.

8. A band pass filter comprising:
a circuit board;
an inductor pattern part formed of a plurality of printed circuit board (PCB) patterns and comprising a first inductor pattern adjacent to a second inductor pattern, and the first inductor pattern and the second inductor pattern are located on a same plane of the circuit board and have a mutual inductance between the first inductor pattern and the second inductor pattern;
a multi-layer ceramic chip (MLCC) part having a capacitance;
a port part formed of an another plurality of PCB patterns and connected to the inductor pattern part,
the second inductor pattern having a same pattern length and pattern width as the first inductor pattern,
the MLCC part comprising:
a first MLCC mounted in a lower end side of the first inductor pattern,
a second MLCC mounted in a lower end side of the second inductor pattern and horizontally symmetrically disposed with respect to the first MLCC, and
a third MLCC;
a first connecting pattern, which is a PCB pattern, configured to connect the first MLCC and the third MLCC;
a second connecting pattern, which is a PCB pattern, configured to connect the second MLCC and the third MLCC,
the port part comprising:
a first port, which is a PCB pattern, formed on the first connecting pattern,
a second port, which is a PCB pattern, formed on the second connecting pattern;
a lower pattern formed at an opposite side of the inductor pattern part;
a dielectric substance formed between the inductor pattern part and the lower pattern; and
via holes formed between the lower pattern and the first inductor pattern and formed between the lower pattern and the second inductor pattern.

9. The band pass filter according to claim 8, wherein the lower pattern is a ground.

10. The band pass filter according to claim 9, wherein the first inductor pattern, the second inductor pattern, the first connecting pattern, the second connecting pattern, the first port, the second port, the lower pattern, and the via holes are formed of a metal material.

11. A band pass filter comprising:
a circuit board;
an inductor pattern part formed of a plurality of printed circuit board (PCB) patterns and comprising a first inductor pattern adjacent to a second inductor pattern, and the first inductor pattern and the second inductor pattern are located on a same plane of the circuit board and have a mutual inductance between the first inductor pattern and the second inductor pattern;
a multi-layer ceramic chip (MLCC) part having a capacitance;
a port part formed of an another plurality of PCB patterns and connected to the inductor pattern part,
the second inductor pattern having a same pattern length and pattern width as the first inductor pattern,
the MLCC part comprising:
a first MLCC mounted in a lower end side of the first inductor pattern,
a second MLCC mounted in a lower end side of the second inductor pattern and horizontally symmetrically disposed with respect to the first MLCC, and
a third MLCC;
a first connecting pattern, which is a PCB pattern, configured to connect the first MLCC and the third MLCC;
a second connecting pattern, which is a PCB pattern, configured to connect the second MLCC and the third MLCC,
the port part comprises:
a first port, which is a PCB pattern, formed on the first connecting pattern in a leftward direction, and
a second port, which is a PCB pattern, formed on the first connecting pattern in a rightward direction;
a lower pattern formed at an opposite side of the inductor pattern part;
a dielectric substance formed between the inductor pattern part and the lower pattern; and
via holes formed between the lower pattern and the first inductor pattern and between the lower pattern and the second inductor pattern.

12. The band pass filter according to claim 11, wherein the lower pattern is a ground.

13. The band pass filter according to claim 12, wherein the first inductor pattern, the second inductor pattern, the first connecting pattern, the second connecting pattern, the first port, the second port, the lower pattern, and the via holes are formed of a metal material.

14. A band pass filter comprising:
a circuit board;
an inductor pattern part formed of a plurality of printed circuit board (PCB) patterns and comprising a first inductor pattern adjacent to a second inductor pattern, the first inductor pattern and the second inductor pattern located on a same plane of the circuit board and have a mutual inductance between the first inductor pattern and the second inductor pattern;
a multi-layer ceramic chip (MLCC) part having a capacitance; and
a port part formed of an another plurality of PCB patterns and connected to the inductor pattern part,
the second inductor pattern has the same pattern length and pattern width as the first inductor pattern, and
the MLCC part comprising:
a third MLCC having a left portion mounted in a lower end side of the first inductor pattern and a right portion mounted in a lower end side of the second inductor pattern;
a first MLCC connected to a left lower end of the third MLCC; and
a second MLCC connected to a right lower end of the third MLCC.

15. The band pass filter according to claim 14, further comprising:
a first connecting pattern, which is a PCB pattern, configured to connect the first MLCC and the third MLCC; and
a second connecting pattern, which is a PCB pattern, configured to connect the second MLCC and the third MLCC and being horizontally symmetrical to the first connecting pattern,
wherein the port part comprises:
a first port, which is a PCB pattern, formed on the first connecting pattern; and
a second port, which is a PCB pattern, formed on the second connecting pattern.

16. The band pass filter according to claim 15, further comprising:

a lower pattern formed on an opposite side of the inductor pattern part;

a dielectric substance formed between the inductor pattern part and the lower pattern; and via holes formed between the lower pattern and the first inductor pattern and between the lower pattern and the second inductor pattern.

17. The band pass filter according to claim 16, wherein the lower pattern is a ground.

18. The band pass filter according to claim 17, wherein the first inductor pattern, the second inductor pattern, the first connecting pattern, the second connecting pattern, the first port, the second port, the lower pattern, and the via holes are formed of a metal material.

19. The band pass filter according to claim 15, further comprising:

a first ground pattern, which is a PCB pattern, connected to an upper end of the first inductor pattern and an upper end of the second inductor pattern; and a second ground pattern, which is a PCB pattern, connected to a lower end of the first MLCC and a lower end of the second MLCC.

20. The band pass filter according to claim 19, further comprising:

a lower pattern formed at an opposite side of the inductor pattern part; and a dielectric substance formed between the inductor pattern part and the lower pattern.

21. The band pass filter according to claim 20, wherein the first inductor pattern, the second inductor pattern, the first connecting pattern, the second connecting pattern, the first port, the second port, the lower pattern, and the via holes are formed of a metal material.

22. A band pass filter comprising:

a circuit board;

an inductor pattern part formed of a plurality of printed circuit board (PCB) patterns comprising a first inductor pattern adjacent to a second inductor pattern, and the first inductor pattern and the second inductor pattern are located on a same plane of the circuit board and having a mutual inductance between the first inductor pattern and the second inductor pattern; and a multi-layer ceramic chip (MLCC) part comprising a first MLCC mounted in a lower end side of the first inductor pattern and having a first capacitance, a second MLCC mounted in a lower end side of the second inductor pattern and having a second capacitance, and a third MLCC having a third capacitance and being connected between the first MLCC and the second MLCC, the first inductor pattern and the second inductor pattern being adjacent to each other and having effects of another capacitance, the mutual inductance and the another capacitance are both connected in parallel with each other to create an effect of a separate filter that is connected in parallel with the third MLCC.

23. The band pass filter of claim 22, wherein at least two of the first capacitance, the second capacitance, and the third capacitance are not equal capacitances.

24. The band pass filter of claim 22, wherein placements of at least the first inductor pattern and the second inductor pattern are used to adjust the effects of the another capacitance and the mutual inductance which result in an adjustment of the effect of the separate filter.

* * * * *